(12) United States Patent
Okuno et al.

(10) Patent No.: US 12,383,962 B2
(45) Date of Patent: Aug. 12, 2025

(54) CUTTING TOOL

(71) Applicant: Sumitomo Electric Hardmetal Corp., Itami (JP)

(72) Inventors: Susumu Okuno, Itami (JP); Takato Yamanishi, Itami (JP); Masahito Hikiji, Itami (JP); Fumiyoshi Kobayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 17/924,364

(22) PCT Filed: May 21, 2021

(86) PCT No.: PCT/JP2021/019379
§ 371 (c)(1),
(2) Date: Nov. 24, 2022

(87) PCT Pub. No.: WO2022/244241
PCT Pub. Date: Nov. 24, 2022

(65) Prior Publication Data
US 2024/0216998 A1   Jul. 4, 2024

(51) Int. Cl.
*B32B 27/14* (2006.01)
*B23B 27/14* (2006.01)
(Continued)

(52) U.S. Cl.
CPC .......... *B23B 27/148* (2013.01); *C23C 16/308* (2013.01); *C23C 16/32* (2013.01);
(Continued)

(58) Field of Classification Search
CPC ....... C23C 16/308; C23C 16/32; C23C 16/34; C23C 16/36; C23C 16/403; C23C 16/56; B23B 2228/105; B23B 27/14
See application file for complete search history.

(56) References Cited

U.S. PATENT DOCUMENTS 5,972,495 A * 10/1999 Ishii ................. C23C 16/0272
428/323
2013/0052455 A1   2/2013 Gates, Jr. et al.
(Continued)

FOREIGN PATENT DOCUMENTS

CN    106660138 A    5/2017
CN    107921551 A    4/2018
(Continued)

OTHER PUBLICATIONS

[NPL-1] Motohana Akira (JP 2016-165789 A); Sep. 15, 2016 (EPO machine translation to English). (Year: 2016).*
(Continued)

*Primary Examiner* — Donald M Flores, Jr.
(74) *Attorney, Agent, or Firm* — XSENSUS LLP

(57) ABSTRACT

A cutting tool includes a substrate and a coating provided on the substrate, the coating including: a first alumina layer provided on the substrate, a titanium compound layer provided directly on the first alumina layer, and a second alumina layer provided directly on the titanium compound layer; in which a portion adjacent to the titanium compound layer in the first alumina layer serves as an interface region, a portion that is not the interface region in the first alumina layer serves as a non-interface region, a content of nitrogen in the interface region is 0.2 at % or more and 10.5 at % or less, and a content of nitrogen in the non-interface region is 0 at % or more and 0.15 at % or less; and the titanium compound layer comprises a layer of titanium carbonitride adjacent to the first alumina layer.

14 Claims, 6 Drawing Sheets

(51) Int. Cl.

| | | |
|---|---|---|
| *C23C 16/30* | (2006.01) | |
| *C23C 16/32* | (2006.01) | |
| *C23C 16/34* | (2006.01) | |
| *C23C 16/36* | (2006.01) | |
| *C23C 16/40* | (2006.01) | |
| *C23C 16/56* | (2006.01) | |

(52) U.S. Cl.
CPC .............. *C23C 16/34* (2013.01); *C23C 16/36* (2013.01); *C23C 16/403* (2013.01); *C23C 16/56* (2013.01); *B23B 2228/105* (2013.01)

(56) References Cited

U.S. PATENT DOCUMENTS

| | | |
|---|---|---|
| 2014/0227547 A1 | 8/2014 | Ri |
| 2017/0190591 A1 | 7/2017 | Imamura et al. |
| 2018/0304376 A1 | 10/2018 | Kawahara |
| 2018/0305823 A1 | 10/2018 | Kawahara |
| 2019/0010606 A1 | 1/2019 | Kubo |
| 2020/0070253 A1 | 3/2020 | Fukushima |
| 2021/0107066 A1 | 4/2021 | Tanaka et al. |
| 2024/0216997 A1 * | 7/2024 | Okuno .................... C23C 16/36 |

FOREIGN PATENT DOCUMENTS

| | | | | |
|---|---|---|---|---|
| CN | 108723400 A | | 11/2018 | |
| CN | 108723404 A | | 11/2018 | |
| EP | 3 670 699 A1 | | 6/2020 | |
| GB | 2061324 A | * | 5/1981 | ............. C23C 16/32 |
| IN | 201717044647 A | | 1/2018 | |
| JP | 11-347806 A | | 12/1999 | |
| JP | 2003-266213 A | | 9/2003 | |
| JP | 2013-46959 A | | 3/2013 | |
| JP | 2016165789 A | * | 9/2016 | |
| JP | 2020-37150 A | | 3/2020 | |
| WO | 2013/031458 A1 | | 3/2013 | |
| WO | 2019/181786 A1 | | 9/2019 | |

OTHER PUBLICATIONS

Related U.S. Appl. No. 17/924,360, filed Nov. 10, 2022 as a U.S. National Phase, 49 pages, P.G.Pub. US 2024/0216997 A1.
Related U.S. Appl. No. 17/924,366, filed Nov. 10, 2022 as a U.S. National Phase, 46 pages, P.G.Pub. US 2024/0218504 A1.
Office Action issued on Aug. 16, 2024, in corresponding related U.S. Appl. No. 17/924,366, 42 pages.
Office Action issued on Aug. 16, 2024, in corresponding related U.S. Appl. No. 17/924,360, 41 pages.
Notice of Allowance issued on Oct. 23, 2024, in related U.S. Appl. No. 17/924,360, 47 pages.
Notice of Allowance issued on Nov. 7, 2024, in related U.S. Appl. No. 17/924,366, 45 pages.
Office Action issued on Nov. 6, 2024, in Chinese patent Application No. 202180035445.1, 16 pages; as concise explanation of relevance for Non-English language information.
Chen Xiang-ming et al., "Thermal oxidation resistance of TiN/TiCN/Al2O3/TiN multilayer coatings on cemented carbide by chemical vapor deposition", The Chinese Journal of Nonferrous Metals, vol. 21, No. 8, Aug. 15, 2011, pp. 1967-1973, total 7 pages; with English Abstract. See the English translation of the Chinese Office Action dated Nov. 6, 2024 for concise explanation of relevance.

* cited by examiner

CUTTING TOOL

The present application is based on PCT filing PCT/JP2021/019379, filed May 21, 2021, the entire contents of which are incorporated herein by reference.

TECHNICAL FIELD

The present disclosure relates to a cutting tool.

BACKGROUND ART

Conventionally, cutting tools including a substrate and a coating thereon have been used. For example, Japanese Patent Laying-Open No. 2020-037150 (PTL 1) discloses a coated cutting tool comprising a substrate and a coating layer formed on a surface of the substrate, wherein: the coating layer comprises a lower layer, an intermediate layer, and an upper layer, the lower layer, the intermediate layer, and the upper layer being laminated in order from the substrate side toward a surface side of the coating layer; the lower layer contains one Ti compound layer or two or more Ti compound layers containing a Ti compound of Ti and an element of at least one kind selected from the group consisting of C, N, O and B; the intermediate layer contains $\alpha$-$Al_2O_3$; the upper layer contains TiCN; an average thickness of the lower layer is from 4.0 μm or more and 10.0 μm or less; an average thickness of the intermediate layer is from 3.0 μm or more and 10.0 μm or less; an average thickness of the upper layer is from 1.5 μm or more and 6.5 μm or less; a ratio of a length of Σ3 grain boundaries to a total 100% length of all grain boundaries in a specific region of the upper layer is 20% or more and 60% or less; and a ratio of (111)-oriented grains in the upper layer is 30 area % or more.

In addition, Japanese Patent Laying-Open No. 2003-266213 (PTL 2) discloses a tool coated with a boron-containing film, the tool including: a base made of cemented carbide, high speed steel, or special steel; an aluminum oxide film on the surface of the base, and the boron-containing film having tensile residual stress on the surface side of the tool rather than the aluminum oxide film, wherein the boron-containing film is a single layer film of any one of carbide, nitride, carbonitride, carboxide, nitroxide, and carbonitroxide of boron and one or more metals of 4a, 5a, and 6a groups in the periodic table or a multilayer film consisting of two or more thereof.

CITATION LIST

Patent Literature

PTL 1: Japanese Patent Laying-Open No. 2020-037150
PTL 2: Japanese Patent Laying-Open No. 2003-266213

SUMMARY OF INVENTION

A cutting tool according to the present disclosure is:
a cutting tool including a substrate and a coating provided on the substrate,
  the coating including:
  a first alumina layer provided on the substrate,
  a titanium compound layer provided directly on the first alumina layer, and
  a second alumina layer provided directly on the titanium compound layer,
  wherein a portion adjacent to the titanium compound layer in the first alumina layer serves as an interface region,
  a portion that is not the interface region in the first alumina layer serves as a non-interface region,
  a content of nitrogen in the interface region is 0.2 at % or more and 10.5 at % or less, and
  a content of nitrogen in the non-interface region is 0 at % or more and 0.15 at % or less; and
  the titanium compound layer includes a layer of titanium carbonitride adjacent to the first alumina layer.

DETAILED DESCRIPTION

Figure 1:
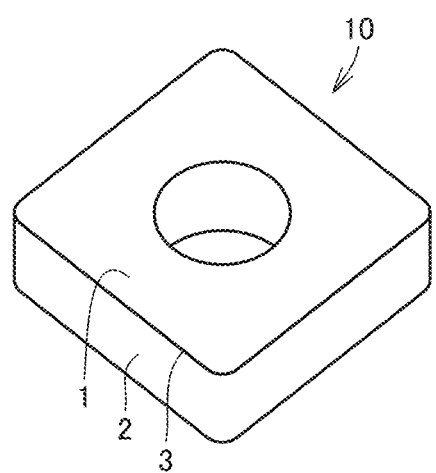
FIG. 1 is a perspective view illustrating one mode of a substrate of a cutting tool.

Problem to be Solved by the Present Disclosure

In PTL 1 and PTL 2, it is expected that wear resistance, and adhesiveness between an aluminum oxide layer and another layer in contact with the aluminum oxide layer are improved due to the coating with a configuration as described above, and that thus the cutting tool has a longer life.

In recent years, however, there has been a tendency that further increase in speed and efficiency is promoted in cutting processing and that a load applied to a cutting tool is thus increased, thereby resulting in a shorter life of the cutting tool. Accordingly, further improvement in mechanical characteristics (e.g., wear resistance, welding resistance, and breaking resistance) of a coating of the cutting tool is needed.

The present disclosure has been made under the aforementioned circumstances, and an object thereof is to provide a cutting tool having improved wear resistance and welding resistance.

Advantageous Effect of the Present Disclosure

According to the present disclosure, a cutting tool having improved wear resistance and welding resistance can be provided.

Description of Embodiments

First, aspects of the present disclosure will be listed and described.

[1] A cutting tool according to the present disclosure is:
a cutting tool including a substrate and a coating provided on the substrate,
  the coating including:
  a first alumina layer provided on the substrate, a titanium compound layer provided directly on the first alumina layer, and a second alumina layer provided directly on the titanium compound layer, wherein a portion adjacent to the titanium compound layer in the first alumina layer serves as an interface region, a portion that is not the interface region in the first alumina layer serves as a non-interface region, a content of nitrogen in the interface region is 0.2 at % or more and 10.5 at % or less, and a content of nitrogen in the non-interface region is 0 at % or more and 0.15 at % or less; and the titanium compound layer comprising a layer of titanium carbonitride adjacent to the first alumina layer.

The cutting tool thus configured has improved wear resistance and welding resistance. As used herein, "wear resistance" means resistance to wear of a coating when the cutting tool is used for cutting processing. As used herein, "welding resistance" means resistance to welding between the cutting tool and workpiece to thereby allow the coating to peel off when the cutting tool is used for cutting processing.

The cutting tool is used for cutting processing such as turning. It is known that the hottest part of the cutting tool in turning is not an edge portion of the cutting tool (cutting edge ridge portion) but a portion slightly away from the edge (portion in contact with chips). In this case, at the edge portion requires high hardness, while the portion slightly away from the edge requires thermal resistance and welding resistance. However, the coating has never before been designed with consideration of the properties needed for each of the edge of the cutting tool and the portion away from the edge. In the present disclosure, both the edge of the cutting tool and the portion away from the edge have succeeded in achieving their respective required properties by further providing the titanium compound layer and the second alumina layer on top of the first alumina layer.

[2] The first alumina layer preferably has a thickness greater than the thickness of the second alumina layer. By specifying in this way, the cutting tool can be excellent in thermal resistance.

[3] The titanium compound layer preferably has a thickness of 1 µm or more and 11 µm or less. By specifying in this way, wear resistance is further improved.

[4] The second alumina layer preferably has a thickness of 0.3 µm or more and 6.5 µm or less. By specifying in this way, welding resistance is further improved.

[5] The first alumina layer preferably has a thickness of 2.5 µm or more and 21.5 µm or less. By specifying in this way, the cutting tool can be excellent in wear resistance.

[6] The interface region of the first alumina layer is preferably a region sandwiched between an interface S with the titanium compound layer and a virtual plane Λ parallel to the interface S that passes through a point 0.5 µm away from the interface S in a thickness direction. By specifying in this way, the cutting tool can be excellent in welding resistance.

[7] The content of nitrogen in the interface region of the first alumina layer is preferably 0.5 at % or more and 10 at % or less. By specifying in this way, it is possible to provide the cutting tool that has excellent adhesiveness between the first alumina layer and the titanium compound layer.

[8] Preferably, the second alumina layer has a thickness of 0.3 µm or more and 6.5 µm or less, and the titanium compound layer has a residual stress of −3 GPa or more and 0 GPa or less. By specifying in this way, it is possible to provide the cutting tool that has further excellent in wear resistance.

[9] Preferably, the titanium compound layer further includes a layer of titanium nitride or titanium carbide. By specifying in this way, the cutting tool can be excellent in wear resistance.

Detailed Description of Embodiments

One embodiment of the present disclosure (hereinafter referred to as the "present embodiment") will be described below. However, the present embodiment is not limited thereto. Herein, an expression in the form of "X to Z" means lower and upper limits of a range (i.e., X or more and Z or less), and when X is not accompanied by any unit with Z alone with a unit, X has the same unit as Z. Further, herein, when a compound is represented by a chemical formula in which compositional ratios of constituent elements are unspecified, such as "TiC", the chemical formula shall include any conventionally known compositional ratio (elemental ratio). On this occasion, the chemical formula shall include not only a stoichiometric composition but also a nonstoichiometric composition. For example, the chemical formula of "TiC" includes not only a stoichiometric composition of "$Ti_1C_1$" but also a nonstoichiometric composition such as "$Ti_1C_{0.8}$". This also applies to descriptions for compounds other than "TiC".

<<Cutting Tool>>

A cutting tool according to the present disclosure is:
a cutting tool including a substrate and a coating provided on the substrate,
the coating including:
a first alumina layer provided on the substrate,
a titanium compound layer provided directly on the first alumina layer, and
a second alumina layer provided directly on the titanium compound layer,
wherein a portion adjacent to the titanium compound layer in the first alumina layer serves as an interface region,
a portion that is not the interface region in the first alumina layer serves as a non-interface region,
a content of nitrogen in the interface region is 0.2 at % or more and 10.5 at % or less, and
a content of nitrogen in the non-interface region is 0 at % or more and 0.15 at % or less; and
the titanium compound layer includes a layer of titanium carbonitride adjacent to the first alumina layer.

Figure 2:
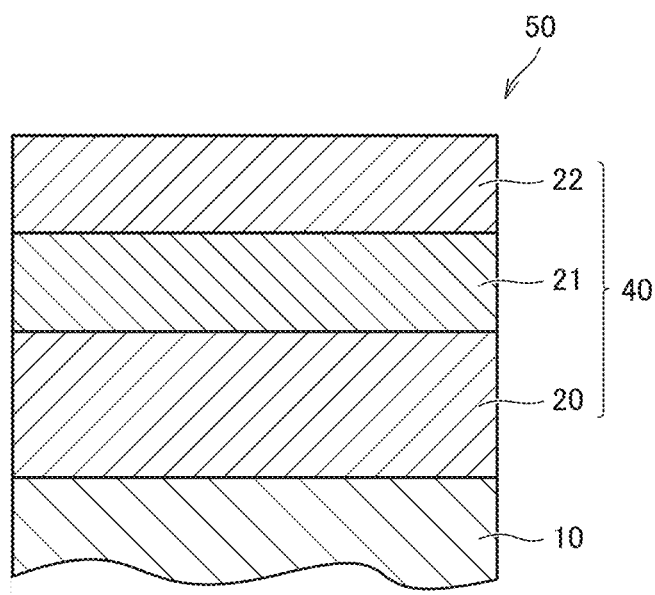
FIG. 2 is a schematic cross section of a cutting tool in one mode of the present embodiment.
Figure 3:
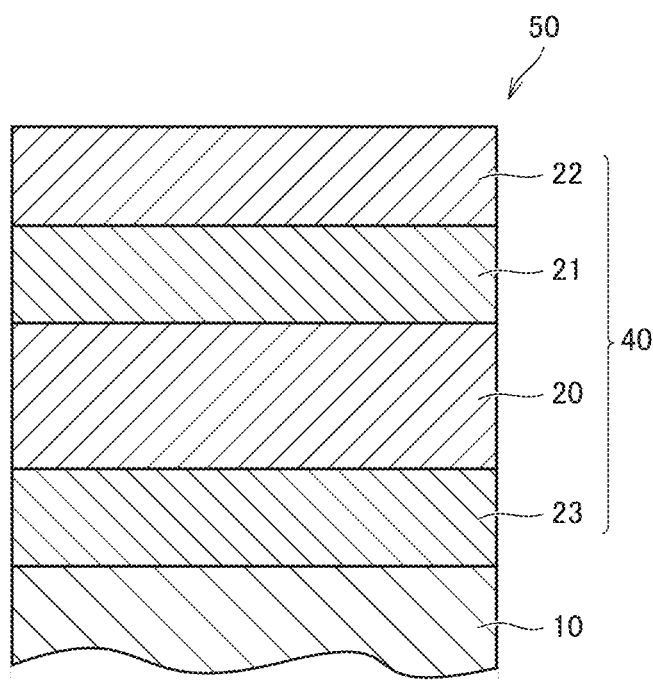
FIG. 3 is a schematic cross section of a cutting tool in another mode of the present embodiment.

A cutting tool 50 of the present embodiment includes a substrate 10, and a coating 40 provided on substrate 10 (hereinafter, which may be simply referred to as a "cutting tool") (FIG. 2). Coating 40 includes a first alumina layer 20 provided on substrate 10, a titanium compound layer 21 provided directly on first alumina layer 20, and a second alumina layer 22 provided directly on titanium compound layer 21. In addition to each of the layers described above, cutting tool 50 may further include an underlying layer 23 provided between substrate 10 and first alumina layer 20 (FIG. 3). Cutting tool 50 may further include a surface layer provided on second alumina layer 22. Other layers such as underlying layer 23 and the surface layer will be described later.

Cutting tool 50 of the present embodiment (hereinafter, which may be simply referred to as a "cutting tool") includes substrate 10, and coating 40 that coats substrate 10 (see FIGS. 2 and 3). In one mode of the present embodiment, the coating may coat a rake face in the substrate, or may coat a portion other than the rake face (e.g., a flank face). The cutting tool can, for example, be a drill, an end mill, an indexable cutting insert for a drill, an indexable cutting insert for an end mill, an indexable cutting insert for milling, an indexable cutting insert for turning, a metal saw, a gear cutting tool, a reamer, or a tap.

<Substrate>

As the substrate in the present embodiment, any substrate conventionally known as a substrate of this type can be used. For example, the substrate preferably includes at least one selected from the group consisting of a cemented carbide (e.g., a tungsten carbide (WC)-based cemented carbide, a cemented carbide containing Co in addition to WC, and a cemented carbide with a carbonitride of Cr, Ti, Ta, Nb, or the like in addition to WC), a cermet (mainly composed of TiC, TiN, TiCN, or the like), a high-speed steel, ceramics (titanium carbide, silicon carbide, silicon nitride, aluminum nitride, aluminum oxide, and the like), a cubic boron nitride sintered material (a cBN sintered material), and a diamond sintered material, and more preferably includes at least one selected from the group consisting of a cemented carbide, a cermet, and a cBN sintered material.

Of these various substrates, a WC-based cemented carbide or a cBN sintered material is particularly preferably selected because these substrates are particularly excellent in balance between hardness and strength at high temperature, and have excellent characteristics as the substrate of the cutting tool for the use described above.

When using a cemented carbide as a substrate, the effect of the present embodiment is exhibited even if the cemented carbide has a structure including free carbon or an extraordinary phase referred to as η phase. The substrate used in the present embodiment may have its surface modified. For example, in the case of the cemented carbide, a β-free layer may be formed on a surface thereof, and in the case of the cBN sintered material, a surface-hardened layer may be formed. The effect of the present embodiment is exhibited even if the surface is modified as described above.

FIG. 1 is a perspective view illustrating one mode of the substrate of the cutting tool. The substrate having such a shape is used as a substrate of an indexable cutting insert for turning, for example. Substrate 10 has a rake face 1, a flank face 2, and cutting edge ridge portion 3, at which rake face 1 intersects with flank face 2. In other words, rake face 1 and flank face 2 are faces that are connected via cutting edge ridge portion 3. Cutting edge ridge portion 3 serves as a cutting edge tip portion of substrate 10. Such a shape of substrate 10 can be recognized also as the shape of the cutting tool.

When the cutting tool is an indexable cutting insert, substrate 10 may have a shape having a chip breaker and a shape not having the same. The shape of cutting edge ridge portion 3 includes any of a sharp edge (a ridge at which a rake face intersects with a flank face), a honed shape (a shape obtained by rounding a sharp edge), a negative land (a beveled shape), and a combination of a honed shape and a negative land.

Although the shape of substrate 10 and the name of each portion thereof have been described with reference to FIG. 1, the same terms as those described above will be used for the shape and the name of each portion corresponding to substrate 10, in cutting tool 50 according to the present embodiment. In other words, the cutting tool has a rake face, a flank face, and a cutting edge ridge portion that connects the rake face and the flank face.

<Coating>

Coating 40 according to the present embodiment includes first alumina layer 20 provided on substrate 10, titanium compound layer 21 provided directly on first alumina layer 20, and second alumina layer 22 provided directly on titanium compound layer 21 (see FIG. 2). The "coating" is applied to at least a portion of the substrate (e.g., the rake face, which comes into contact with a workpiece during cutting processing), thereby functioning to improve various characteristics such as breaking resistance, wear resistance, and welding resistance of the cutting tool. The coating is preferably applied not only to a portion of the substrate but also to the entire surface of the substrate. However, a case where the substrate is partially uncovered with the coating and a case where the coating is partially different in configuration are also within the scope of the present embodiment.

The coating preferably has a thickness of 10 μm or more and 40 μm or less, and more preferably 15 μm or more and 35 μm or less. Here, the thickness of the coating means a total thickness of any layers constituting the coating. Examples of the "layers constituting the coating" include a first alumina layer, a titanium compound layer, a second alumina layer, an underlying layer, and a surface layer, as will be described later. For example, the thickness of the coating can be determined by measuring at 10 arbitrary points in a cross-sectioned sample parallel to the direction of a normal to a surface of the substrate with a field-emission scanning electron microscope (SEM), and calculating an average value of the thicknesses found at the 10 points. On this occasion, the cross section for measurement of the cross-sectioned sample is polished by ion milling. The same also applies to measurement of the thicknesses of the first alumina layer, the titanium compound layer, the second alumina layer, the underlying layer, the surface layer, and the like described later. Examples of the field-emission scanning electron microscope include SU3500 (trade name) manufactured by Hitachi High-Tech Corporation. Examples of a hybrid ion-milling machine include IM4000 (trade name) manufactured by Hitachi High-Tech Corporation.

(First Alumina Layer)

First alumina layer 20 in the present embodiment is provided on substrate 10. As used herein, "being provided on the substrate" includes not only a case where the layer is provided directly on the substrate (see FIG. 2), but also a case where the layer is provided on the substrate with another layer interposed therebetween (see FIG. 3). In other words, as long as the effect of the present disclosure is exhibited, the first alumina layer may be provided directly on the substrate, or may be provided on the substrate with another layer, such as the underlying layer described later, interposed therebetween.

The first alumina layer may be made of aluminum oxide ($Al_2O_3$) only, or may be composed of aluminum oxide and an inevitable impurity. Examples of the inevitable impurity include chlorine and sulfur. The aluminum oxide is preferably α-type aluminum oxide (α-$Al_2O_3$).

(Content of Nitrogen in Interface Region and Non-Interface Region of First Alumina Layer)

Figure 4:
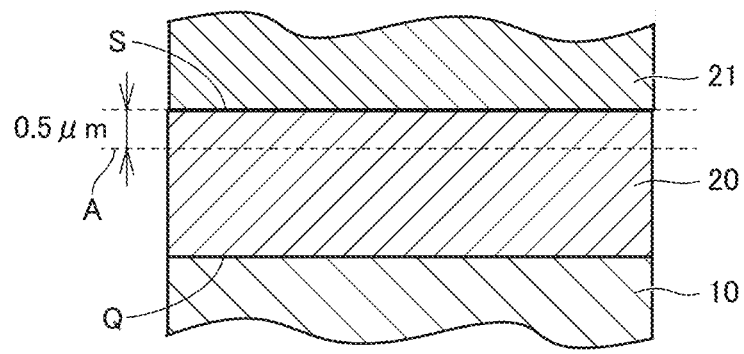
FIG. 4 is a schematic cross section of a coating in one mode of the present embodiment.

The portion adjacent to the titanium compound layer in the first alumina layer serves as an interface region. In addition, the portion that is not the interface region in the first alumina layer serves as a non-interface region. The interface region of the first alumina layer is preferably a region sandwiched between an interface S with the titanium compound layer and a virtual plane A parallel to the interface S that passes through a point 0.5 μm away from the interface S in the thickness direction (FIG. 4). The non-interface region of the first alumina layer is preferably a region sandwiched between the virtual plane A and the interface Q on the substrate side of the first alumina layer (FIG. 4). In the first alumina layer, there may be or may not be a clear boundary between the interface region and the non-interface region.

The content of nitrogen in the interface region of the first alumina layer is 0.2 at % or more and 10.5 at % or less, preferably 0.5 at % or more and 10 at % or less, and more preferably 1 at % or more and 9 at % or less. Here, the content of nitrogen is an atomic ratio to the total of aluminum, oxygen, and nitrogen in the first alumina layer.

In the first alumina layer having a configuration as described above, more nitrogen atoms are distributed in the interface region with the titanium compound layer. Accordingly, the nitrogen atoms diffuse from the interface region into the titanium compound layer, thereby improving the adhesiveness between the first alumina layer and the titanium compound layer. Since the titanium compound layer conventionally provided on an alumina layer only needs to serve as a layer for displaying the usage state, the adhesiveness with the alumina layer and other mechanical properties were not considered important. In addition, it is conventionally known that the presence of nitrogen inside the alumina layer causes thermal instability, resulting in a decrease in performance of the alumina layer. Therefore, nitrogen has not been proactively added to the inside of the alumina layer in the past.

In the present disclosure, the distribution of more nitrogen atoms in the interface region of the first alumina layer improves the adhesiveness with the titanium compound layer (especially, the layer of titanium carbonitride adjacent to the first alumina layer), and can further impart predetermined mechanical properties to the titanium compound layer.

The content of nitrogen can be determined by performing line analysis on the cross-sectioned sample parallel to the direction of the normal to the surface of the substrate described above by Auger electron spectroscopy (AES). Specifically, a cut surface of the cross-sectioned sample is first polished by cross section polisher processing (CP processing) or the like. Analysis with a field-emission scanning electron microscope (FE-SEM) is performed on the polished cut surface to obtain a cross sectional SEM image in the substrate (an underlying layer when the underlying layer is provided), the first alumina layer, and the titanium compound layer. The measurement magnification on this occasion is 50000 times. On this occasion, the substrate, the underlying layer, and the titanium compound layer are observed as dark regions, while the first alumina layer is observed as a bright region. Then, line analysis is performed on the polished cut surface by the AES, in a field of view in the cross sectional SEM image, from the titanium compound layer side toward the first alumina layer side in a direction parallel to a direction in which the titanium compound layer is stacked. The measurement pitch on this occasion is 0.016 μm. Other measurement conditions for the AES are those described below. Examples of a measurement apparatus for the AES include PHI700 (trade name) manufactured by ULVAC-PHI, Inc.

(Measurement Conditions for AES)
Measurement acceleration voltage: 10 kV
Measurement current: 10 mA
Sample inclination angle: 30°
Sputtering voltage: 1 kV Based on the results of the line analysis described above, a graph is created in which the X axis (axis of abscissas) represents the distance from a measurement start point, and the atomic ratio (at %) of each element to be measured is plotted on the Y axis (axis of ordinates). Based on this graph, a point where the atomic ratio of aluminum is 10 at % and which is closer to the titanium compound layer is defined as the "interface S between the first alumina layer and the titanium compound layer" (see FIG. 4). In addition, a plane including a point 0.5 μm away from the interface S on the side of the first alumina layer is defined as the "virtual plane A" (see FIG. 4). Based on the graph, an average value of the atomic ratios of nitrogen in a region sandwiched between the interface S and the virtual plane A (interface region) is then determined.

The measurement as described above is made in at least triplicate, and an average value of the values determined in the respective measurements is defined as the content of nitrogen in the interface region of the first alumina layer.

The content of nitrogen in the non-interface region of the first alumina layer is 0 at % or more and 0.15 at % or less, and preferably 0 at % or more and 0.1 at % or less. The content of nitrogen in the non-interface region can be determined by performing line analysis on the cross-sectioned sample by the AES in the same manner as described above. On this occasion, in the graph obtained based on the results of the line analysis, a point where the atomic ratio of aluminum is 10 at % and which is closer to the substrate is defined as the "interface Q on the substrate side of the first alumina layer" (see FIG. 4). Based on the graph, an average value of the atomic ratios of nitrogen in a region sandwiched between the virtual plane A and the interface Q (non-interface region) is then determined. The measurement as described above is made in at least triplicate, and an average value of the values determined in the respective measurements is defined as content of nitrogen in the non-interface region of the first alumina layer.

The first alumina layer preferably has a thickness of 2.5 μm or more and 21.5 μm or less, more preferably 3 μm or more and 20 μm or less, and further preferably 6 μm or more and 17 μm or less. The thickness of the first alumina layer can be determined by observing a vertical cross section of the substrate and the coating with a SEM in the same manner as that described above.

In one mode of the present embodiment, the first alumina layer preferably has a thickness greater than the thickness of the second alumina layer.

(Titanium Compound Layer)

Titanium compound layer 21 according to the present embodiment is provided directly on first alumina layer 20 (FIG. 2). The titanium compound layer includes a layer of titanium carbonitride (TiCN) adjacent to the first alumina layer. In one mode of the present embodiment, it can also be recognized that the layer of titanium carbonitride is provided directly on the first alumina layer. The titanium compound layer may include the layer of titanium carbonitride adjacent to the first alumina layer only, or may be composed of the layer of titanium carbonitride adjacent to the first alumina layer and another layer of titanium compound. The layer of titanium carbonitride may be made of titanium carbonitride only, or may be composed of titanium carbonitride and an inevitable impurity. Examples of the inevitable impurity include oxygen, chlorine, and the like. The titanium compound layer preferably has a thickness of 1 μm or more and 11 μm or less, more preferably 1.5 μm or more and 9.5 μm or less, and further preferably 2.5 μm or more and 8.5 μm or less. The titanium compound layer is thinner than conventional ones. However, the titanium compound layer has a predetermined residual stress as described later, and thus is a layer having sufficient hardness. The thickness of the titanium compound layer can be determined by observing a vertical cross section of the substrate and the coating with a SEM in the same manner as that described above.

The layer of titanium carbonitride preferably has a thickness of 1 μm or more and 11 μm or less, more preferably 1.5 μm or more and 9.5 μm or less, and further preferably 3.0 μm or more and 8.0 μm or less. The thickness of the layer of titanium carbonitride can be determined by observing a vertical cross section of the substrate and the coating with a SEM in the same manner as that described above.

In one mode of the present embodiment, the titanium compound layer preferably further includes a layer of titanium nitride (TiN) or titanium carbide (TiC).

The layer of titanium nitride or titanium carbide preferably has a thickness of 0.5 μm or more and 5.5 μm or less, and more preferably 0.5 μm or more and 2.5 μm or less. The thickness of the layer of titanium nitride or titanium carbide can be determined by observing a vertical cross section of the substrate and the coating with a SEM in the same manner as that described above.

The titanium compound layer preferably has a residual stress of −3 GPa or more and 0 GPa or less, and more preferably −2.5 GPa or more and −0.5 GPa or less.

As used herein, the "residual stress" refers to one type of internal stress (inherent strain) in a layer. The residual stress is divided roughly into a compressive residual stress and a tensile residual stress. The compressive residual stress refers to a residual stress represented by a numerical value with "−" (minus) (herein, the unit thereof is "GPa"). For example, it can be understood that a "compressive residual stress of 10 GPa" is a residual stress of −10 GPa. Therefore, a concept of large compressive residual stress indicates that the absolute value of the above-described numerical value is large, while a concept of small compressive residual stress indicates that the absolute value of the above-described numerical value is small. The tensile residual stress refers to a residual stress represented by a numerical value with "+" (plus) (herein, the unit thereof is "GPa"). For example, it can be understood that a "tensile residual stress of 10 GPa" is a residual stress of 10 GPa. Therefore, a concept of large tensile residual stress indicates that the above-described numerical value is large, while a concept of small tensile residual stress indicates that the numerical value is small.

In the present embodiment, the residual stress of the titanium compound layer is determined by a residual stress measurement performed in accordance with $2\theta-\sin^2\psi$ method using X rays. As a specific method thereof is as follows. First, for the whole of the field of view for measurement, the crystal plane interval of the (331) plane, the diffraction plane of titanium carbonitride, is measured in accordance with the $2\theta-\sin^2\psi$ method. Here, an angle of diffraction corresponding to a crystal plane to be measured is designated as an angle of diffraction during the measurement. The field of view for measurement described above means a "field of view for measurement in the surface of the titanium compound layer". Next, based on the found crystal plane interval of the (331) plane, the residual stress of the whole of the field of view for measurement is calculated. Such measurement is performed for a plurality of fields of view for measurement, and the average value of residual stresses determined in the respective fields of view for measurements is defined as a "residual stress of the titanium compound layer".

In the present embodiment, the residual stress is measured by the $2\theta-\sin^2\psi$ method under the following conditions.
Apparatus: SmartLab (manufactured by Rigaku Corporation)
X-ray: Cu/Kα/45 kV/200 mA
Counter: D/teX Ultra250 (manufactured by Rigaku Corporation)
Diffraction plane to be measured: (331) plane
Scanning range: 72° to 74° (inclination method)
(Second Alumina Layer)

Second alumina layer 22 in the present embodiment is provided directly on titanium compound layer 21. On the second alumina layer, another layer such as the surface layer may be provided. The second alumina layer may be the outermost surface of the coating. The second alumina layer may be made of aluminum oxide ($Al_2O_3$) only, or may be composed of aluminum oxide and an inevitable impurity. Examples of the inevitable impurity include chlorine and sulfur. The aluminum oxide is preferably α-type aluminum oxide (α-$Al_2O_3$). The second alumina layer may have a composition identical to or different from that of the first alumina layer. The second alumina layer preferably has a thickness of 0.3 μm or more and 6.5 μm or less, more preferably 0.5 μm or more and 5 μm or less, and further preferably 1 μm or more and 4.5 μm or less. The second alumina layer is thinner than conventional ones. However, since the second alumina layer is thin, a predetermined residual stress can be given to the titanium compound layer by blasting after formation of the second alumina layer, as described later. The thickness of the second alumina layer can be determined by observing a vertical cross section of the substrate and the coating with a SEM in the same manner as that described above.

In one mode of the present embodiment, the second alumina layer preferably has a thickness of 0.3 μm or more and 6.5 μm or less, while the titanium compound layer preferably has a residual stress of −3 GPa or more and 0 GPa or less.

In one mode of the present embodiment, a portion adjacent to the titanium compound layer in the second alumina layer serves as an interface region and may contain nitrogen in the interface region. Here, the portion that is not the interface region in the second alumina layer serves as a non-interface region. The interface region of the second alumina layer is preferably a region sandwiched between an interface R with the titanium compound layer and a virtual plane B parallel to the interface R that passes through a point 0.5 μm away from the interface R in the thickness direction. The content of nitrogen in the interface region of the second alumina layer is preferably 0.5 at % or more and 10 at % or less. In this way, it is possible to provide the cutting tool that has excellent adhesiveness between the second alumina layer and the titanium compound layer. In one mode of the present embodiment, the content of nitrogen in the non-interface region of the second alumina layer is preferably 0 at % or more and 0.15 at % or less. The content of nitrogen in the interface region or non-interface region of the second alumina layer can be determined by performing line analysis on the cross-sectioned sample by the AES according to the method described above.
(Underlying Layer)

Preferably, coating 40 further includes underlying layer 23 provided between substrate 10 and first alumina layer 20 (see FIG. 3). Underlying layer 23 preferably includes titanium nitride (TiN), titanium carbonitride (TiCN), or titanium carbonitroxide (TiCNO). The TiN, TiCN and TiCNO are each preferably a cubic crystal.

The underlying layer preferably has a thickness of 3 μm or more and 20 μm or less, and more preferably 5 μm or more and 15 μm or less. Such a thickness can be determined by observing a vertical cross section of the substrate and the coating with a SEM in the same manner as that described above.

(Surface Layer)

Preferably, the coating further includes a surface layer provided on the second alumina layer. The surface layer preferably includes a compound composed of a titanium element and at least one element selected from the group consisting of C, N, and B.

Examples of the compound included in the surface layer include TiC, TiN, TiCN, and $TiB_2$.

The surface layer preferably has a thickness of 0.2 μm or more and 3 μm or less, and more preferably 0.5 μm or more and 1.5 μm or less. Such a thickness can be determined by observing a vertical cross section of the substrate and the coating with a SEM in the same manner as that described above.

(Another Layer)

The coating may further include another layer as long as the effect exhibited by the cutting tool according to the present embodiment is not impaired. The other layer may have a composition different from or identical to that of the first alumina layer, the titanium compound layer, the second alumina layer, the underlying layer, or the surface layer. Examples of a compound included in the other layer include TiN, TiCN, TiBN, and $Al_2O_3$. The order of stacking the other layer is not particularly limited. The thickness of the other layer is not particularly limited as long as the effect of the present embodiment is not impaired, and it may be, for example, 0.1 μm or more and 20 μm or less.

<<Method for Manufacturing Cutting Tool>>

A method for manufacturing a cutting tool according to the present embodiment includes:
  a first step of providing a substrate (which may be hereinafter simply referred to as a "first step");
  a second step of forming the first alumina layer on the substrate through chemical vapor deposition (which may be hereinafter simply referred to as a "second step");
  a third step of forming the titanium compound layer directly on the first alumina layer through chemical vapor deposition (which may be hereinafter simply referred to as a "third step"); and
  a fourth step of forming the second alumina layer directly on the titanium compound layer through chemical vapor deposition (which may be hereinafter simply referred to as a "fourth step"),
  wherein at the end of the second step, the first alumina layer is formed by using a raw material gas containing a gas containing aluminum as a constituent element, a gas containing nitrogen as a constituent element, and a gas containing oxygen as a constituent element, and
  in the third step, a layer of titanium carbonitride is formed directly on the first alumina layer.

<First Step: Providing Substrate>

In the first step, a substrate is provided. For example, a cemented carbide substrate is provided as the substrate. The cemented carbide substrate may be a commercially available product, or may be manufactured by a common powder metallurgy method. When the cemented carbide substrate is manufactured by a common powder metallurgy method, WC powder, Co powder, and the like are mixed by a ball mill or the like to obtain a powder mixture, for example. The powder mixture is dried and then is formed into a predetermined shape, thereby obtaining a shaped body. Further, by sintering the shaped body, a WC—Co based cemented carbide (sintered material) is obtained. Next, the sintered material is subjected to predetermined cutting edge processing such as honing, thereby manufacturing a substrate made of the WC—Co based cemented carbide. In the first step, any conventionally known substrate of this type other than the above-described substrate can be provided.

<Second Step: Forming the First Alumina Layer on the Substrate>

In the second step, the first alumina layer is formed on the substrate through chemical vapor deposition (CVD). In addition, at the end of the second step, the first alumina layer is formed by using a raw material gas containing a gas containing aluminum as a constituent element, a gas containing nitrogen as a constituent element, and a gas containing oxygen as a constituent element.

Figure 5:
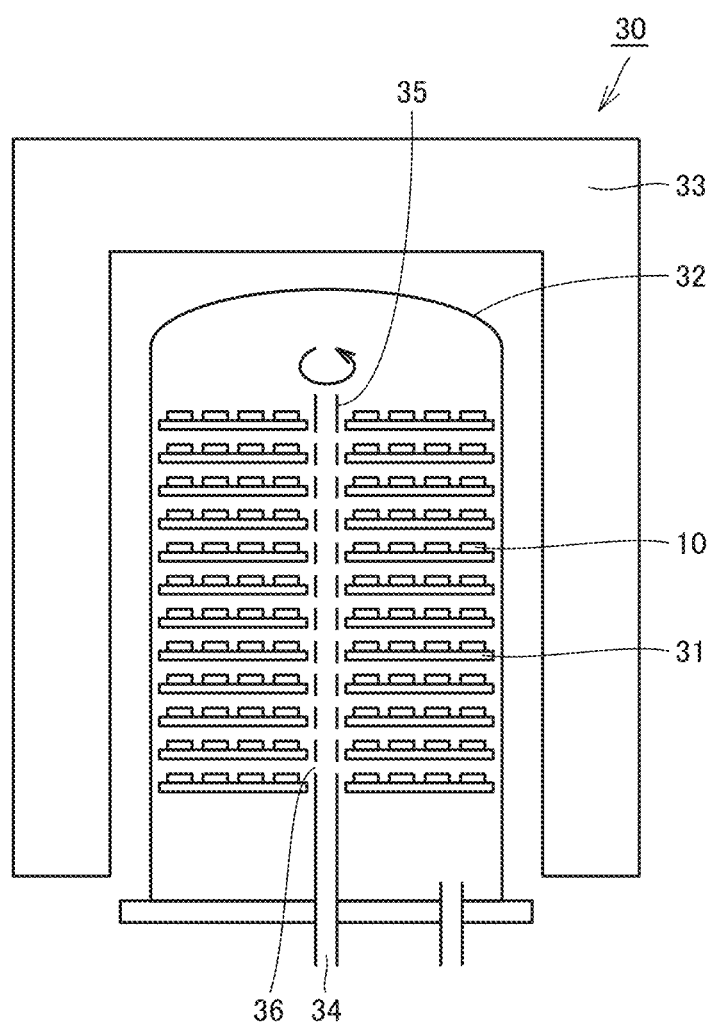
FIG. 5 is a schematic cross section showing one example of a chemical vapor deposition apparatus used for manufacturing the coating.

FIG. 5 is a schematic cross section of one example of a chemical vapor deposition apparatus (CVD apparatus) used for manufacturing the coating. The second step will be described below with reference to FIG. 5. CVD apparatus 30 includes a plurality of substrate setting jigs 31 for holding substrates 10, and a reaction container 32 made of a heat-resistant alloy steel that covers substrate setting jigs 31. In addition, a temperature adjustment apparatus 33 for controlling the temperature within reaction container 32 is provided around reaction container 32. A gas introduction pipe 35 having a gas introduction port 34 is provided to reaction container 32. Gas introduction pipe 35 is arranged in an internal space of reaction container 32 in which substrate setting jigs 31 are arranged, so as to extend in a vertical direction and to be rotatable about the vertical direction. In addition, a plurality of ejection holes 36 for ejecting a gas into reaction container 32 are provided to gas introduction pipe 35. Using this CVD apparatus 30, the first alumina layer and the like constituting the coating can be formed as described below.

First, substrates 10 are set to substrate setting jigs 31, and a raw material gas for the first alumina layer is introduced into reaction container 32 through gas introduction pipe 35 while controlling the temperature and the pressure within reaction container 32 to be in predetermined ranges, whereby first alumina layer 20 is formed on substrate 10. Here, it is preferable to form an underlying layer (e.g., a layer including TiN) on a surface of substrate 10 by introducing a raw material gas for the underlying layer into reaction container 32 through gas introduction pipe 35, before formation of first alumina layer 20 (i.e., before the second step). A method for forming first alumina layer 20 after formation of the underlying layer on the surface of substrate 10 will be described below.

The raw material gas for the underlying layer is not particularly limited, and for a case where a TiN layer, for example, is formed, examples thereof include a mixed gas of $TiCl_4$ and $N_2$. For a case where a TiCN layer is formed, examples of the raw material gas include a mixed gas of $TiCl_4$, $N_2$, $CH_3CN$, $CH_4$, and $C_2H_4$. For a case where a TiCNO layer is formed, examples of the raw material gas include a mixed gas of $TiCl_4$, $N_2$, CO, and $CH_4$.

The temperature in reaction container 32 during the formation of the underlying layer is preferably controlled to fall within a range of 1000 to 1100° C. The pressure in reaction container 32 during the formation of the underlying layer is preferably controlled to fall within a range of 0.1 to 1013 hPa. It is preferable to use $H_2$ as a carrier gas. It is preferable to rotate gas introduction pipe 35 by a driving unit not shown in the figure during gas introduction, whereby, each gas can be uniformly dispersed within reaction container 32.

Further, the underlying layer may be formed by a MT (medium temperature)-CVD method. Unlike a CVD method carried out at a temperature of 1000 to 1100° C. (hereinafter also referred to as a "HT-CVD method"), the MT-CVD method is a method in which a layer is formed while maintaining the temperature within reaction container 32 at a temperature as relatively low as 850 to 950° C. Since the MT-CVD method is carried out at a relatively low temperature compared with the HT-CVD method, damage to substrate 10 due to heating can be reduced. In particular, when the underlying layer is a TiN layer, it is preferable to form the underlying layer by the MT-CVD method.

Then, the first alumina layer is formed on the underlying layer. As the raw material gas in the nucleation stage, a mixed gas of $AlCl_3$, CO, $CO_2$, and HCl is used, for example. As the raw material gas in the crystal growth stage, a mixed gas of $AlCl_3$, CO, $CO_2$, HCl, and $H_2S$ is used, for example. As the raw material gas at the end of the second step, a mixed gas of $AlCl_3$ (a gas containing aluminum as a constituent element), CO, $CO_2$, HCl and $N_2$ (gases containing nitrogen as a constituent element) is used, for example.

The content of $AlCl_3$ in the raw material gas is preferably 1 to 5 vol %, more preferably 1.5 to 4 vol %, and further preferably 2 to 3.5 vol %. A preferable flow rate of $AlCl_3$ is 0.5 to 3.5 L/min.

The content of CO in the raw material gas is preferably 0.5 to 4 vol %, more preferably 0.8 to 3.5 vol %, and further preferably 1 to 2.5 vol %. A preferable flow rate of CO is 0.5 to 2 L/min.

The content of $CO_2$ in the raw material gas is preferably 0.2 to 2.5 vol %, more preferably 0.3 to 2 vol %, and further preferably 0.5 to 1.5 vol %. A preferable flow rate of $CO_2$ is 0.4 to 1.5 L/min.

The content of HCl in the raw material gas is preferably 1 to 6 vol %, more preferably 1.5 to 5.5 vol %, and further preferably 2 to 4.5 vol %. A preferable flow rate of HCl is 0.5 to 4.5 L/min.

The content of $H_2S$ in the raw material gas is preferably 0.5 to 3.5 vol %, more preferably 1.0 to 3.0 vol %, and further preferably 1.5 to 2.5 vol %. A preferable flow rate of $H_2S$ is 0.3 to 2.5 L/min.

The content of $N_2$ in the raw material gas is preferably 0.1 to 1 vol %, more preferably 0.2 to 0.8 vol %, and further preferably 0.3 to 0.6 vol %. A preferable flow rate of $N_2$ is 0.1 to 0.5 L/min.

The temperature in reaction container 32 is preferably controlled to fall within a range of 950 to 1000° C. The pressure in reaction container 32 is preferably controlled to fall within a range of 50 to 100 hPa. It is preferable to use $H_2$ as a carrier gas. It is preferable to rotate gas introduction pipe 35 during gas introduction, as described above.

Regarding the manufacturing method described above, the mode of each layer is changed by controlling conditions for the CVD method. For example, the composition of each layer is determined by the composition of the raw material gas introduced into reaction container 32. The thickness of each layer is controlled by an operation time (a film formation time).

<Third Step: Forming Titanium Compound Layer Directly on First Alumina Layer>

In the third step, the titanium compound layer is formed directly on the first alumina layer through chemical vapor deposition. In the third step, the layer of titanium carbonitride is formed directly on the first alumina layer.

As the raw material gas for the layer of titanium carbonitride, a mixed gas of $TiCl_4$, $CH_4$, and $N_2$ is used, for example.

The content of $TiCl_4$ in the raw material gas is preferably 2 to 7 vol %, more preferably 3 to 6 vol %, and further preferably 3.5 to 5.5 vol %. A preferable low rate of $TiCl_4$ is 1.4 to 4.9 L/min.

The content of $CH_4$ in the raw material gas is preferably 2 to 7 vol %, more preferably 2.5 to 6.5 vol %, and further preferably 3 to 6 vol %. A preferable flow rate of $CH_4$ is 1 to 5 L/min.

The content of $N_2$ in the raw material gas is preferably 5 to 35 vol %, more preferably 7.5 to 30 vol %, and further preferably 10 to 25 vol %. A preferable flow rate of $N_2$ is 3.5 to 24.5 L/min.

The temperature in reaction container 32 is preferably controlled to fall within a range of 950 to 1000° C. The pressure in reaction container 32 is preferably controlled to fall within a range of 50 to 200 hPa. It is preferable to use $H_2$ as a carrier gas. It is preferable to rotate gas introduction pipe 35 during gas introduction, as described above.

In one mode of the present embodiment, in addition to the layer of titanium carbonitride, layers of titanium nitride, titanium carbide, titanium carbonitroxide, and the like may also be formed as layers constituting the titanium compound layer, in the third step.

<Fourth Step: Forming the Titanium Compound Layer Directly on the Second Alumina Layer>

In the fourth step, the second alumina layer is formed directly on the titanium compound layer through chemical vapor deposition.

As the raw material gas, a mixed gas of $AlCl_3$, CO, $CO_2$, $H_2S$, HCl, and $TiCl_4$ is used, for example.

The content of $AlCl_3$ in the raw material gas is preferably 1 to 5 vol %, more preferably 1.5 to 4 vol %, and further preferably 2 to 3.5 vol %. A preferable flow rate of $AlCl_3$ is 0.5 to 3.5 L/min.

The content of CO in the raw material gas is preferably 0.5 to 4 vol %, more preferably 0.8 to 3.5 vol %, and further preferably 1 to 2.5 vol %. A preferable flow rate of CO is 0.3 to 3 L/min.

The content of $CO_2$ in the raw material gas is preferably 0.2 to 2.5 vol %, more preferably 0.3 to 2 vol %, and further preferably 0.5 to 1.5 vol %. A preferable flow rate of $CO_2$ is 0.1 to 1.5 L/min.

The content of $H_2S$ in the raw material gas is preferably 0.2 to 2.5 vol %, more preferably 0.3 to 2.0 vol %, and further preferably 0.5 to 1.5 vol %. A preferable flow rate of $H_2S$ is 0.1 to 1.5 L/min.

The content of HCl in the raw material gas is preferably 1 to 7 vol %, more preferably 1.5 to 6.5 vol %, and further preferably 2 to 6 vol %. A preferable flow rate of HCl is 0.5 to 4.5 L/min, and a more preferable flow rate thereof is 1 to 4 L/min.

The content of $TiCl_4$ in the raw material gas is preferably 0.01 to 0.09 vol %, more preferably 0.02 to 0.08 vol %, and further preferably 0.03 to 0.07 vol %. A preferable flow rate of $TiCl_4$ is 0.05 to 0.6 L/min. The inclusion of $TiCl_4$ in the raw material gas can improve the adhesion between the titanium compound layer and the second alumina layer.

The temperature in reaction container 32 is preferably controlled to fall within a range of 950 to 1000° C. The pressure in reaction container 32 is preferably controlled to fall within a range of 50 to 200 hPa. It is preferable to use $H_2$ as a carrier gas. It is preferable to rotate gas introduction pipe 35 during gas introduction, as described above.

In one mode of the present embodiment, the second alumina layer may be formed, at the early stage of the fourth step, by using a raw material gas containing a gas containing aluminum as a constituent element, a gas containing nitrogen as a constituent element, and a gas containing oxygen as a constituent element. In this way, it is possible to provide the cutting tool that has excellent adhesiveness between the second alumina layer and the titanium compound layer. As the raw material gas, a mixed gas of $AlCl_3$, CO, $CO_2$, $H_2S$, HCl, $TiCl_4$, and $N_2$ is used, for example. The respective contents of $AlCl_3$, CO, $CO_2$, $H_2S$, HCl, and $TiCl_4$ in the raw material gas are preferably in the ranges described above.

The content of $N_2$ in the raw material gas is preferably 0.1 to 1 vol %, more preferably 0.2 to 0.8 vol %, and further preferably 0.3 to 0.6 vol %. A preferable flow rate of $N_2$ is 0.1 to 0.5 L/min, and a more preferable flow rate thereof is 0.2 to 0.4 L/min.

<Other Step(s)>

In the manufacturing method according to the present embodiment, an additional step may be performed appropriately in addition to the steps described above, as long as the effects of the present embodiment are not impaired. Examples of the additional steps include a step of forming the surface layer on the second alumina layer and a step of performing blasting treatment on the coating. In the present embodiment, the thickness of the second alumina layer directly on the titanium compound layer is thinner than the thickness of the first alumina layer. Therefore, a predetermined residual stress can be given to the titanium compound layer by blasting after the fourth step. The conditions of the blasting treatment are, for example, those described in the examples below. A method for forming the surface layer is not particularly limited, and examples thereof include a method in which the CVD or the like is used for forming the surface layer.

EXAMPLES

Hereinafter, the present invention will be described in detail with reference to Examples, but the present invention is not limited thereto.

<<Producing Cutting Tool>>

<First Step: Providing Substrate>

As a substrate, a cemented carbide cutting insert (shape: CNMG120408N-UX; manufactured by Sumitomo Electric Industries HardMetal Ltd.; JIS B4120 (2013)) was provided, composition of which includes TaC (2.0 mass %), NbC (1.0 mass %), Co (10.0 mass %) and WC (balance) (also including an inevitable impurity).

<Forming Underlying Layer>

Prior to the second step described later, an underlying layer was formed on the provided substrate under conditions of the composition of the raw material gas and the film formation listed in Table 1, using a CVD apparatus. The film formation time was adjusted appropriately to reach the thicknesses shown in Table 5. The thickness of the underlying layer and the composition of the underlying layer are shown in Table 5. In Table 5, the composition of the underlying layer is listed in order of proximity to the substrate, along with its thickness. For example, the expression "TiN (1.0)/TiCN (12.5)/TiCNO (1.5)" means that the layers of TiN (1.0 μm in thickness), TiCN (12.5 μm in thickness), and TiCNO (1.5 μm in thickness) are formed sequentially from the layer closest to the substrate.

TABLE 1

| Underlying layer | Composition of raw material gas (Vol %) | | | | | | | Total gas flow rate (L/min) | Pressure (hPa) | Temperature (° C.) |
| --- | --- | --- | --- | --- | --- | --- | --- | --- | --- | --- |
| | $TiCl_4$ | $N_2$ | $CH_3CN$ | $CH_4$ | $C_2H_4$ | CO | $H_2$ | | | |
| TiN | 3.0 | 24.0 | — | — | — | — | balance | 58 | 200 | 900 |
| TiCN | 4.0 | 20.0 | 0.7 | 1.0 | 0.5 | — | balance | 95 | 80 | 880 |
| TiCNO | 2.0 | 24.0 | — | 2.8 | — | 3.2 | balance | 50 | 250 | 980 |

<Second Step: Forming First Alumina Layer on Substrate>

A first alumina layer was formed on the provided substrate or a substrate having the underlying layer formed thereon, using the CVD apparatus, and then the procedure moved on to the subsequent third step. Conditions for forming the first alumina layer are shown in Table 2. As shown in Table 2, the first alumina layer was deposited while changing the composition of the raw material gas according to the stages of "nucleation" (early stage), "crystal growth" (middle stage), and "N-containing layer formation" (end stage). For samples 101 and 103, the first alumina layer was deposited in two stages: "nucleation" (early stage) and "crystal growth" (middle stage), without using the raw material gas in the "N-containing layer formation" (end stage). The film formation time was adjusted appropriately to reach the thicknesses shown in Table 5. The thickness of the first alumina layer and the composition of the first alumina layer are shown in Table 5.

TABLE 2

| First alumina layer | Composition of raw material gas (Vol %) | | | | | | | Total gas flow rate (L/min) | Pressure (hPa) | Temperature (° C.) |
| --- | --- | --- | --- | --- | --- | --- | --- | --- | --- | --- |
| | $AlCl_3$ | CO | $CO_2$ | HCl | $H_2S$ | $N_2$ | $H_2$ | | | |
| Nucleation | 2.5 | 1.0 | 1.5 | 2.0 | — | — | balance | 60 | 70 | 1000 |
| Crystal growth | 3.2 | 2.5 | 1.0 | 4.5 | 2.0 | — | balance | 70 | 65 | 1000 |
| Formation of N-containing layer | 2.0 | 2.5 | 0.5 | 2.5 | — | 0.5 | balance | 50 | 65 | 1000 |

<Third Step: Forming Titanium Compound Layer Directly on First Alumina Layer>

Then, on the substrate having the first alumina layer formed thereon, a titanium compound layer was formed directly on the first alumina layer using the CVD apparatus. Here, in the third step, a layer of titanium carbonitride was formed directly on the first alumina layer. Conditions for forming the titanium compound layer are shown in Table 3. The film formation time was adjusted appropriately to reach the thicknesses shown in Table 5. The thickness of the titanium compound layer and the composition of titanium compound layer are shown in Table 5. In Table 5, the composition of the titanium compound layer is listed in order of proximity to the first alumina layer, along with its thickness. For example, the expression "TiCN (5.5)/TiN (2.0)" means that the layers of TiCN (5.5 μm in thickness) and TiN (2.0 μm in tackiness) are formed sequentially from the layer closest to the first alumina layer.

TABLE 3

| Titanium compound layer | Composition of raw material gas (Vol %) | | | | | Total gas flow rate (L/min) | Pressure (hPa) | Temperature (° C.) |
| --- | --- | --- | --- | --- | --- | --- | --- | --- |
| | $TiCl_4$ | $N_2$ | $CH_4$ | CO | $H_2$ | | | |
| TiCNO | 3.0 | 20.0 | 2.2 | 2.8 | balance | 50 | 200 | 1000 |
| TiCN | 4.0 | 20.0 | 5.0 | — | balance | 70 | 80 | 1000 |
| TiC | 2.4 | — | 4.6 | — | balance | 45 | 80 | 1000 |
| TiN | 7.5 | 40.0 | — | — | balance | 50 | 340 | 1000 |

<Fourth Step: Step of Forming Second Alumina Layer Directly on Titanium Compound Layer>

Then, on the substrate having the titanium compound layer formed thereon, a second alumina layer was formed directly on the titanium compound layer using the CVD apparatus. The conditions for forming the second alumina layer are shown in Table 4. The film formation time was adjusted appropriately to reach the thicknesses shown in Table 5. The thickness of the second alumina layer and the composition of the second alumina layer are shown in Table 5.

TABLE 4

| Second alumina layer | Composition of raw material gas (Vol %) | | | | | | Total gas flow rate (L/min) | Pressure (hPa) | Temperature (° C.) |
| --- | --- | --- | --- | --- | --- | --- | --- | --- | --- |
| | $AlCl_3$ | CO | $CO_2$ | HCl | $H_2S$ | $TiCl_4$ | $H_2$ | | |
| $Al_2O_3$ | 2.8 | 2.0 | 1.5 | 5.0 | 0.5 | <0.1 | balance | 60 | 65 | 950 |

<Step of Forming Surface Layer>

A surface layer was formed on the substrate having the second alumina layer formed thereon using the CVD apparatus. Conditions for forming the surface layer are described below. The thickness and the composition of the surface layer are shown in Table 5. In Table 5, the mark "–" means that the corresponding layer is not provided.

(In the Case of TiN)
  Composition of raw material gas: $TiCl_4$ (8.0 vol %), $N_2$ (35.0 vol %), $H_2$ (balance)
  Total gas flow rate: 60 L/min
  Pressure: 300 hPa
  Temperature: 1005° C.

(In the Case of TiC)
  Composition of raw material gas: $TiCl_4$ (3.5 vol %), $CH_4$ (4.5 vol %), $H_2$ (balance)
  Total gas flow rate: 40 L/min
  Pressure: 80 hPa
  Temperature: 1005° C.

<Step of Performing Blast Treatment>

Finally, the resulting coating was blasted under the following conditions while rotating the cutting tool at 90 rpm about a through hole in the center of the rake face.

Conditions for Blasting Treatment
  Media: water solvent containing 7 vol % of ceramic particles with a particle size of 100 μm as abrasive grains
  Blasting angle: 45° to the rotation axis
  Blasting distance: 10 mm distanced from the cutting edge ridge portion
  Blasting pressure: 0.05 to 0.10 MPa
  Blasting time: 5 to 20 seconds The blasting pressure and the blasting time were adjusted to reach the residual stresses shown in Table 6.

TABLE 5

| Sample | Underlying layer Thickness (μm) | First alumina layer Thickness (μm) | Titanium compound layer Thickness (μm) | Second alumina layer Thickness (μm) | Surface layer Thickness (μm) |
| --- | --- | --- | --- | --- | --- |
| 1 | TiN(1.0)/TiCN(12.5)/TiCNO(1.5) | α-$Al_2O_3$ (8.5) | TiCN(5.5)/TiN(2.0) | α-$Al_2O_3$ (3.0) | — |
| 2 | TiN(0.5)/TiCN(5.0)/TiCNO(1.0) | α-$Al_2O_3$ (12.0) | TiCN(4.0)/TiN(1.5) | α-$Al_2O_3$ (2.0) | — |
| 3 | TiN(0.5)/TiCN(4.0)/TiCNO(1.0) | α-$Al_2O_3$ (5.5) | TiCN(7.5)/TiC(3.5) | α-$Al_2O_3$ (3.5) | — |
| 4 | TiN(1.5)/TiCN(9.5)/TiCNO(1.0) | α-$Al_2O_3$ (6.5) | TiCN(1.0) | α-$Al_2O_3$ (4.0) | — |
| 5 | TiN(0.5)/TiCN(2.5)/TiCNO(0.5) | α-$Al_2O_3$ (21.5) | TiCN(2.5)/TiCNO(1.5)/TiN(2.5) | α-$Al_2O_3$ (1.5) | — |
| 6 | TiN(1.5)/TiCN(15.0)/TiCNO(2.0) | α-$Al_2O_3$ (2.5) | TiCN(4.5)/TiCNO(3.0)/TiC(2.0) | α-$Al_2O_3$ (3.5) | — |
| 7 | TiN(0.5)/TiCN(4.0)/TiCNO(1.0) | α-$Al_2O_3$ (19.5) | TiCN(5.0)/TiCNO(2.0) | α-$Al_2O_3$ (6.5) | — |
| 8 | TiN(1.5)/TiCN(11.0)/TiCNO(1.5) | α-$Al_2O_3$ (7.5) | TiCN(6.5)/TiC(1.5) | α-$Al_2O_3$ (0.3) | — |

TABLE 5-continued

| Sample | Underlying layer Thickness (μm) | First alumina layer Thickness (μm) | Titanium compound layer Thickness (μm) | Second alumina layer Thickness (μm) | Surface layer Thickness (μm) |
|---|---|---|---|---|---|
| 9 | TiN(2.0)/TiCN(14.5)/TiCNO(1.0) | α-Al$_2$O$_3$ (4.0) | TiCN(5.5)/TiN(2.0) | α-Al$_2$O$_3$ (5.0) | TiN (0.8) |
| 10 | TiN(1.0)/TiCN(6.5)/TiCNO(1.0) | α-Al$_2$O$_3$ (10.5) | TiCN(4.0)/TiC(1.0)/TiN(1.5) | α-Al$_2$O$_3$ (2.5) | — |
| 11 | TiN(1.5)/TiCN(8.0)TiCNO(1.0) | α-Al$_2$O$_3$ (8.5) | TiCN(4.5)/TiCNO(1.0)/TiN(2.0) | α-Al$_2$O$_3$ (3.5) | TiC (1.0) |
| 12 | TiN(0.5)/TiCN(5.0)/TiCNO(1.0) | α-Al$_2$O$_3$ (16.5) | TiCN(3.0)/TiC(1.5) | α-Al$_2$O$_3$ (2.5) | — |
| 101 | TiN(1.0)/TiCN(8.5)/TiCNO(1.0) | α-Al$_2$O$_3$ (10.5) | — | — | — |
| 102 | TiCN(10.0)TiCNO(2.0) | α-Al$_2$O$_3$ (7.0) | TiCN(3.5)/TiN(1.0) | — | — |
| 103 | TiN(1.5)/TiCN(14.0) | α-Al$_2$O$_3$ (5.0) | TiN(2.5) | α-Al$_2$O$_3$ (1.5) | — |

Cutting tools of samples 1 to 12 and 101 to 103 were thus produced through the above process.

<<Evaluating Characteristics of Cutting Tool>>

For the cutting tools of the samples produced as described above, characteristics of the cutting tools were evaluated as follows. Here, samples 1 to 12 correspond to Examples, and samples 101 to 103 correspond to Comparative Examples.

<Measuring Thickness of Each Layer Constituting Coating>

The thickness of each layer constituting the coating was determined by measuring at 10 arbitrary points in a cross-sectioned sample parallel to the direction of a normal to a surface of the substrate with a field-emission scanning electron microscope (SEM) (manufactured by Hitachi High-Tech Corporation, trade name: SU3500) and calculating an average value of the found thicknesses at the 10 points. On this occasion, the cross section for measurement of the cross-sectioned sample was polished by ion milling (manufactured by Hitachi High-Tech Corporation, trade name: IM4000). Results are shown in Tables 5 and 6.

<Contents of Nitrogen in Interface Region and Non-Interface Region of First Alumina Layer (AES Measurement)>

The atomic ratio of each element (oxygen, nitrogen, and aluminum) in the interface region and non-interface region of the first alumina layer was determined by performing line analysis on the cross-sectioned sample parallel to the direction of the normal to the surface of the substrate described above by Auger electron spectroscopy (AES). Specifically, a cut surface of the cross-sectioned sample was first polished by cross section polisher processing. Analysis with a field-emission scanning electron microscope (FE-SEM) was performed on the polished cut surface to obtain a cross sectional SEM image in the underlying layer, the first alumina layer, and the titanium compound layer. The measurement magnification on this occasion was 50000 times. On this occasion, the underlying layer and the titanium compound layer are observed as a dark region, while the first alumina layer is observed as a bright region. Then, line analysis was performed on the polished cut surface by the AES, in a field of view in the cross sectional SEM image, from the titanium compound layer side toward the first alumina layer side in a direction parallel to a direction in which the titanium compound layer is stacked. The measurement pitch on this occasion was 0.016 μm. Other measurement conditions for the AES were those described below.

(Measurement Conditions for AES)

Measurement apparatus: PHI700 (trade name) manufactured by ULVAC-PHI, Inc.

Measurement acceleration voltage: 10 kV

Measurement current: 10 mA

Sample inclination angle: 30°

Sputtering voltage: 1 kV

A graph was created from data obtained by the line analysis described above. In the graph, the X axis (axis of abscissas) represents the distance from a measurement start point, and the Y axis (axis of ordinates) represents the atomic ratio (at %) of each element to be measured. Based on this graph, a point where the atomic ratio of aluminum is 10 at % and which is closer to the titanium compound layer was then defined as the "interface S between the first alumina layer and the titanium compound layer" (see FIG. 4, for example). In addition, a plane including a point 0.5 μm away from the interface S on the side of the first alumina layer was defined as the "virtual plane A" (see FIG. 4, for example). In the graph, a point where the atomic ratio of aluminum is 10 at % and closer to the substrate was defined as the "interface Q on the substrate side of the first alumina layer" (see FIG. 4). Based on the graph, an average value of the atomic ratios of nitrogen in a region sandwiched between the interface S and the virtual plane A (interface region) and an average value of the atomic ratios of nitrogen in a region sandwiched between the virtual plane A and the interface Q (non-interface region) were each determined. Such a measurement was made in at least triplicate, and an average value of the values determined in the respective measurements was defined as the content of nitrogen in the interface region of the first alumina layer, or the content of nitrogen in the non-interface region of the first alumina layer. Results are shown in Table 6.

(Residual Stress in Titanium Compound Layer)

The residual stress in the titanium compound layer was measured by the $2\theta-\sin^2\psi$ method under the following conditions. Results are shown in Table 6. In Table 6, a residual stress indicated by a negative numerical value means a compressive residual stress, while a residual stress indicated by a positive numerical value means a tensile residual stress.

Apparatus: SmartLab (manufactured by Rigaku Corporation)

X-ray: Cu/Kα/45 kV/200 mA

Diffraction plane to be measured: (331) plane

Counter: D/teX Ultra250 (manufactured by Rigaku Corporation)

Scanning range: 72° to 74° (inclination method)

TABLE 6

| | First alumina layer | | | Titanium compound layer | | Second alumina layer | Cutting performance | |
|---|---|---|---|---|---|---|---|---|
| | | Content of nitrogen in | Content of nitrogen in | | | | Wear resistance | Surface |
| Sample | Thickness (μm) | non-interface region (at %) | interface region (at %) | Thickness (μm) | Residual stress (GPa) | Thickness (μm) | Cuttable time (min) | quality Rank |
| 1 | 8.5 | 0.10 | 3.5 | 7.5 | −1.8 | 3.0 | 25.5 | A |
| 2 | 12.0 | 0.05 | 4.5 | 5.5 | −2.5 | 2.0 | 26.5 | A |
| 3 | 5.5 | 0.05 | 6.4 | 11.0 | −1.5 | 3.5 | 27.0 | C |
| 4 | 6.5 | 0.15 | 4.2 | 1.0 | −2.0 | 4.0 | 18.5 | A |
| 5 | 21.5 | 0.05 | 5.5 | 6.5 | −1.8 | 1.5 | 27.0 | B |
| 6 | 2.5 | 0.10 | 3.0 | 9.5 | −0.6 | 3.5 | 20.0 | A |
| 7 | 19.5 | 0.05 | 0.6 | 7.0 | −1.6 | 6.5 | 26.5 | C |
| 8 | 7.5 | 0.10 | 5.6 | 8.0 | −1.2 | 0.3 | 21.5 | A |
| 9 | 4.0 | 0.10 | 8.5 | 7.5 | −1.8 | 5.0 | 19.5 | B |
| 10 | 10.5 | 0.00 | 0.2 | 6.5 | −2.4 | 2.5 | 24.5 | C |
| 11 | 8.5 | 0.10 | 10.5 | 7.5 | −2.3 | 3.5 | 15.5 | A |
| 12 | 16.5 | 0.05 | 7.5 | 4.5 | 0.5 | 2.5 | 24.5 | C |
| 101 | 10.5 | 0.00 | 0.0 | — | — | — | 7.5 | C |
| 102 | 7.0 | 0.05 | 0.6 | 4.5 | −0.5 | — | 10.5 | E |
| 103 | 5.5 | 0.00 | 0.0 | 2.5 | −0.5 | 1.5 | 8.5 | E |

<<Cutting Test>>
(Cutting Evaluation 1: Continuous Processing Test, Evaluation of Wear Resistance)

Using the cutting tools of the thus produced samples (samples 1 to 12 and 101 to 103) under the cutting conditions indicated below, a cutting time (min) taken for the flank face to wear by 0.3 mm was measured. Results thereof are shown in Table 6. A cutting tool providing a longer cutting time can be assessed as a cutting tool excellent in wear resistance.

Conditions for Continuous Processing
Workpiece: S25C (shape: round bar material)
Cutting speed: 300 m/min
Feed speed: 0.2 mm/rev
Cutting depth: 1.5 mm
Cutting oil: present (Cutting Evaluation 2: Evaluation of Surface Quality)

Figure 6:
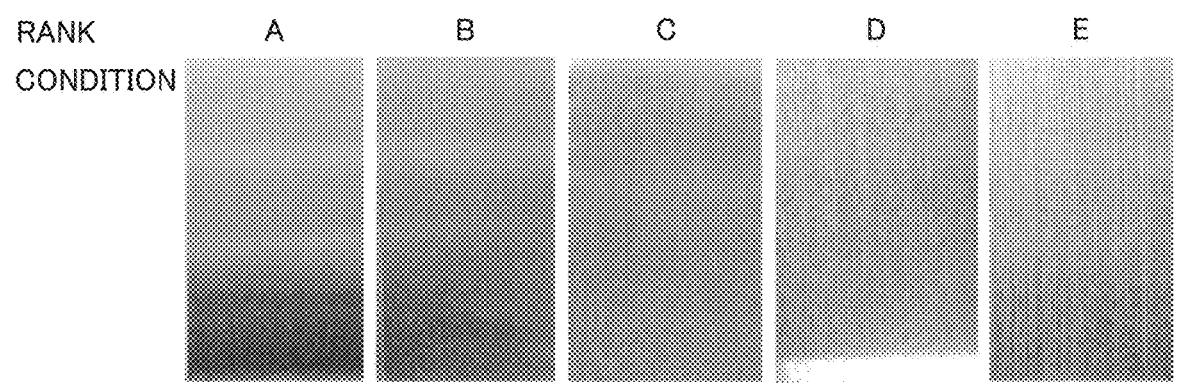
FIG. 6 is a photograph showing the surface quality of a processed surface and the rank corresponding thereto.

In the cutting test, the processed surface of the workpiece was visually observed one minute after the start of the cutting process. On the basis of the cloudiness and blurring on the processed surfaces observed, the samples were ranked from A to E according to the criteria shown in FIG. 6. Results are shown in Table 6. Surfaces with ranks A to C were assessed as good processed surfaces. Cutting evaluation 2 can be conducted to assess the welding resistance of the cutting tools.

As clear from the results in Table 6, the cutting tools of samples 1 to 12 (cutting tools of the examples) provided good results, specifically, a cutting time of 15 minutes or more in cutting evaluation 1. On the other hands, the cutting tools of samples 101 to 103 (cutting tools of the comparative examples) provided a cutting time of less than 15 minutes in cutting evaluation 1. From the above results, it has been found that the cutting tools of the examples are more excellent in wear resistance than the cutting tools of the comparative examples.

As clear from the results in Table 6, the cutting tools of samples 1 to 12 (cutting tools of the examples) provided good results, specifically, surface qualities of ranks A to C in cutting evaluation 2. On the other hands, the cutting tools of samples 102 and 103 (cutting tools of the comparative examples) had a surface quality of rank E in cutting evaluation 2. The cutting tool of sample 101 (cutting tool of the comparative example) provided a cutting time of 7.5 minutes in the cutting evaluation 1 though it had a surface quality of rank C in cutting evaluation 2, and wear resistance and welding resistance were thus incompatible with each other in the cutting tool of sample 101.

From the above results, it has been found that the cutting tools of the examples are more excellent in wear resistance and welding resistance than the cutting tools of the comparative examples.

Although the embodiments and examples of the present invention have been described above, it is also initially contemplated to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include the meaning equivalent to the terms of the claims and any modifications within the scope of the claims.

REFERENCE SIGNS LIST

1: rake face, 2: flank face, 3: cutting edge ridge portion, 10: substrate, 20: first alumina layer, 21: titanium compound layer, 22: second alumina layer, 23: underlying layer, 30: CVD apparatus, 31: substrate setting jig, 32: reaction container, 33: temperature controller, 34: gas introduction port, 35: gas introduction pipe, 36: ejection hole, 40: coating, 50: cutting tool, A: virtual plane including point 0.5 μm away from an interface S between the first alumina layer and the titanium compound layer on the side of the first alumina layer; Q: interface Q of the first alumina layer on the side of the substrate, and S: interface S between the first alumina layer and titanium compound layer.

The invention claimed is:
1. A cutting tool comprising a substrate and a coating provided on the substrate, the coating comprising:
a first alumina layer provided on the substrate,
a titanium compound layer provided directly on the first alumina layer, and
a second alumina layer provided directly on the titanium compound layer, wherein a portion adjacent to the titanium compound layer in the first alumina layer serves as an interface region, a portion that is not the interface region in the first alumina layer serves as a non-interface region, a content of nitrogen in the interface region is 0.2 at % or more and 10.5 at % or less, and a content of nitrogen in the non-interface region is 0 at % or more and 0.15 at % or less; and the titanium compound layer comprises a layer of titanium carbonitride adjacent to the first alumina layer.

2. The cutting tool according to claim 1, wherein the first alumina layer has a thickness greater than the thickness of the second alumina layer.

3. The cutting tool according to claim 1, wherein the titanium compound layer has a thickness of 1 μm or more and 11 μm or less.

4. The cutting tool according to claim 1, wherein the second alumina layer has a thickness of 0.3 μm or more and 6.5 μm or less.

5. The cutting tool according to claim 1, wherein the first alumina layer has a thickness of 2.5 μm or more and 21.5 μm or less.

6. The cutting tool according to claim 5, wherein the interface region of the first alumina layer is a region sandwiched between an interface S with the titanium compound layer and a virtual plane A parallel to the interface S that passes through a point 0.5 μm away from the interface S in a thickness direction.

7. The cutting tool according to claim 1, wherein the content of nitrogen in the interface region of the first alumina layer is 0.5 at % or more and 10 at % or less.

8. The cutting tool according to claim 1, wherein the second alumina layer has a thickness of 0.3 μm or more and 6.5 μm or less, and the titanium compound layer has a residual stress of −3 GPa or more and 0 GPa or less.

9. The cutting tool according to claim 1, wherein the titanium compound layer further comprises a layer of titanium nitride or titanium carbide.

10. The cutting tool according to claim 1, wherein the titanium compound layer has a thickness of 2.5 μm or more and 8.5 μm or less.

11. The cutting tool according to claim 1, wherein the layer of titanium carbonitride has a thickness of 1 μm or more and 8.0 μm or less.

12. The cutting tool according to claim 1, wherein the coating has a thickness of 10 μm or more and 40 μm or less.

13. The cutting tool according to claim 1, wherein the coating further includes an underlying layer provided between the substrate and the first alumina layer.

14. The cutting tool according to claim 1, wherein the coating further includes a surface layer provided on the second alumina layer.

* * * * *

UNITED STATES PATENT AND TRADEMARK OFFICE
CERTIFICATE OF CORRECTION

PATENT NO. : 12,383,962 B2  
APPLICATION NO. : 17/924364  
DATED : August 12, 2025  
INVENTOR(S) : Susumu Okuno Page 1 of 1

It is certified that error appears in the above-identified patent and that said Letters Patent is hereby corrected as shown below:

On the Title Page

Item (86) § 371 (c)(1),(2) Date should appear as follows: Nov. 10, 2022.

Signed and Sealed this  
Eleventh Day of November, 2025

John A. Squires  
*Director of the United States Patent and Trademark Office*